United States Patent
Salmon et al.

(10) Patent No.: US 6,581,274 B1
(45) Date of Patent: Jun. 24, 2003

(54) APPARATUS FOR CONFIGURING AND INSERTING COMPONENT LEADS INTO PRINTED-CIRCUIT BOARDS

(75) Inventors: Michael E. Salmon, Madison, AL (US); Gary L. Dumer, Union Grove, AL (US); Martin F. Folgmann, Madison, AL (US); William S. Hyde, Decatur, AL (US)

(73) Assignee: Trans Tron Ltd., Inc., Huntsville, AL (US)

( * ) Notice: Subject to any disclaimer, the term of this patent is extended or adjusted under 35 U.S.C. 154(b) by 0 days.

(21) Appl. No.: 09/578,258

(22) Filed: May 24, 2000

(51) Int. Cl.[7] .............................. B23P 19/00; H05K 3/30
(52) U.S. Cl. .............................. 29/741; 29/835; 29/838
(58) Field of Search ......................... 29/842, 844, 845, 29/884, 739, 741, 832, 833, 834, 835, 837, 838, 839; 227/116, 149

(56) References Cited

U.S. PATENT DOCUMENTS

| | | | |
|---|---|---|---|
| 3,267,716 A | * | 8/1966 | Hales ........................... 72/384 |
| 3,516,142 A | | 6/1970 | De Rose et al. |
| 3,535,763 A | * | 10/1970 | Helton ........................... 29/741 |
| 3,538,580 A | * | 11/1970 | Bruner ........................... 29/741 |
| 3,564,691 A | | 2/1971 | Ackerman |
| 3,628,244 A | | 12/1971 | Halstead |
| 3,896,533 A | | 7/1975 | Ullman et al. |
| 4,172,317 A | | 10/1979 | Kober et al. |
| 4,369,819 A | * | 1/1983 | Kinoshita et al. .......... 29/566.3 |
| 4,461,073 A | | 7/1984 | Harringer et al. |
| 4,543,713 A | | 10/1985 | Rapp |
| 4,597,174 A | | 7/1986 | Sevigny |
| 4,616,414 A | | 10/1986 | Cushman |
| 4,627,156 A | | 12/1986 | Vancelette |
| 4,819,326 A | | 4/1989 | Stannek |
| 5,327,640 A | | 7/1994 | Janssen et al. |
| 5,491,890 A | | 2/1996 | Dowell et al. |
| 5,709,576 A | | 1/1998 | Lippmann et al. |
| 5,815,917 A | | 10/1998 | Clark et al. |
| 5,924,192 A | | 7/1999 | Wuyts |
| 5,933,943 A | * | 8/1999 | Chou ........................... 29/741 |
| 5,964,397 A | | 10/1999 | Dautartas |

* cited by examiner

Primary Examiner—Timothy V. Eley
(74) Attorney, Agent, or Firm—Brooks & Kushman P.C.

(57) ABSTRACT

Apparatus having a mandrel, and a ring having an aperture therein, the ring being slidable over the mandrel. A multilead electronic component having electric leads extending therefrom is positioned atop the mandrel. The ring is pressed over the mandrel, bending the electric leads downward. When the ring is retracted, springback forces within the bent electric leads forces them against the inside of the ring; and the multilead electronic component is retained therewithin. The ring is then used, either manually or robotically, to position the component proximate a printed-circuit board with the electric leads aligned with connection apertures in the printed-circuit board. The multilead electronic component is pressed toward the printed-circuit board, forcing the leads through the connection apertures; and the ring is withdrawn for subsequent use. Another embodiment provides a pusher, which is manually or robotically slidable within the ring aperture, to press the multilead electronic component toward the printed-circuit board.

11 Claims, 10 Drawing Sheets

APPARATUS FOR CONFIGURING AND INSERTING COMPONENT LEADS INTO PRINTED-CIRCUIT BOARDS

TECHNICAL FIELD

The present invention relates generally to apparatuses for the insertion of electronic component leads into connection apertures in printed-circuit boards and more particularly to apparatuses using the same element both to configure the leads and to insert them into the apertures.

BACKGROUND ART

Automated apparatuses for positioning electronic components with respect to a printed-circuit board and then pressing the component toward the board to force electric leads extending from the component through connection apertures in the board are well known in the field of automated electrical and electronic assembly. Early components typically had leads of sufficient size and attendant stiffness to retain their orientation and configuration and thereby facilitate their insertion into generally aligned apertures. Such apparatuses became less efficient for inserting finer leads into smaller apertures at a rate proportional to the increasing number of leads extending from an electronic component and to the decreasing diameter of the leads and of the spaces between them.

Since many components are manufactured with electric leads extending in directions that are not the same as required for mounting, the leads must be reoriented before the components are mounted. If the leads exit components made of glass or other brittle material, forces applied to bend the leads to reorient them can easily fracture the material proximate places where leads pass through and destroy seals therebetween. The effectiveness of given automated apparatuses for bending component leads is a similar function of the number, diameter and mutual spacing of the apertures and leads and is also a function of the materials of which the component is made.

Once the leads have been reoriented, the components must be positioned for mounting on a printed-circuit board; and the leads must then be inserted into proper connection apertures in the board. The effectiveness of given automated apparatuses for positioning and inserting component leads depends similarly on the number, diameter and mutual spacing of the apertures and leads and also depends on the configuration of the component.

While the prior techniques function with a certain degree of efficiency, none disclose the advantages of the improved apparatuses and method for inserting component leads into printed-circuit boards as is hereinafter more fully described.

DISCLOSURE OF INVENTION

The apparatus of the present invention facilitates feeding electric leads of a multilead electronic component through connection apertures of a printed-circuit board. The apparatus includes a ring having a vertically extending aperture. The aperture is defined by a plurality of sides and has dimensions that allow the ring to be pressed over the multilead electronic component. While the ring is being pressed over the multilead electronic component, it contacts and bends the electric leads while maintaining a desired lead centerline separation. The multilead electronic component is thereafter temporarily retained within the ring aperture by virtue of springback forces within the bent electric leads acting against two opposite sides of the aperture. This positions the electric leads relative to the connection apertures in the printed-circuit board.

BRIEF DESCRIPTION OF DRAWINGS

A more complete appreciation of the invention and many of the attendant advantages thereof may be readily obtained by reference to the following detailed description when considered with the accompanying drawings in which like reference characters indicate corresponding parts in all the views, wherein:

FIG. 4b is a bottom view of the elements shown in FIG. 4a;

BEST MODE FOR CARRYING OUT THE INVENTION

The present invention includes two basic embodiments. The first embodiment includes apparatus to facilitate configuring and feeding electric leads of a multilead electronic component through connection apertures in a printed-circuit board. The second embodiment includes an apparatus to facilitate feeding electric leads of a multilead electronic component through connection apertures in a printed-circuit board. It has fewer elements and is primarily intended to be used manually.

Although the description in this portion of the specification sometimes refers to directions, such as vertical, horizontal, upward and downward, it is to be noted that, for the sake of clarity and convenience, these are to be viewed with respect to the orientation of the drawing figures and that the combinations of elements need not be oriented as shown to function as described.

Figure 1:
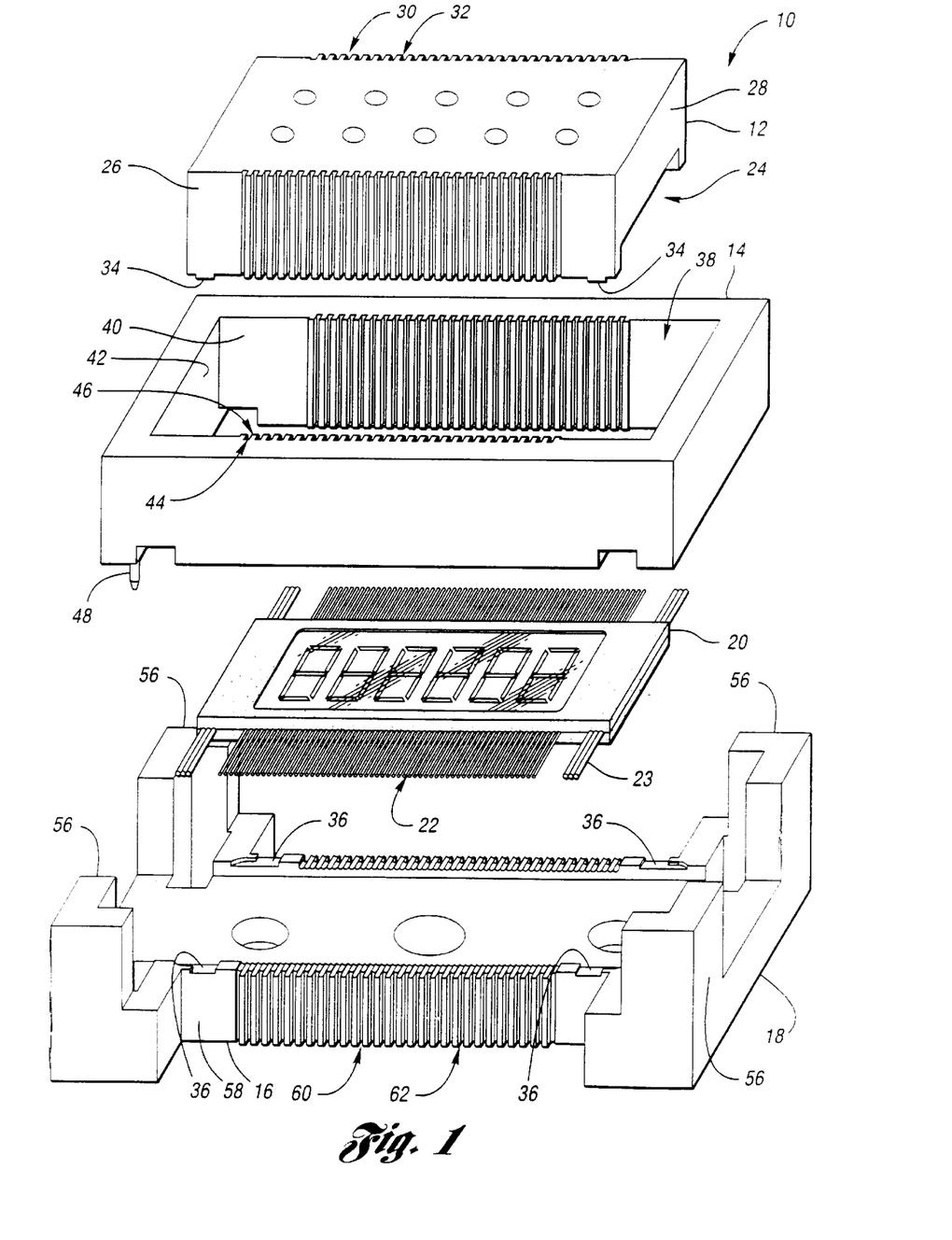
FIG. 1 is an exploded perspective view of a first embodiment of the present invention and includes a ring, a pusher and a mandrel, for bending electric leads shown extending from a multilead electronic component.

FIG. 1 of the drawing shows an exploded, perspective view of a first embodiment of the present invention, generally indicated by reference numeral 10. Included are a pusher 12; a ring, or die, 14; and a base 18 having an elongate central portion that forms a mandrel 16. FIG. 1 shows the mandrel 16 and the base 18 formed as one piece, but it should be noted that they could readily be formed individually. Also shown is a representation of a multilead electronic component 20 having a plurality of leads, generally indicated by reference numerals 22, and as is typical, extending from two opposite sides. The leads 22 are shown extending linearly from the multilead electronic component 20, but it should be noted that components having prebent leads (FIG. 25) are commonly available.

The pusher 12 shown has the general shape of a rectangular prism and has an elongate recess, generally indicated by reference numeral 24, extending along the underside length thereof to provide space, for the body of the multilead electronic component 20. As shown, the pusher 12 has a pair of oppositely disposed, vertically extending, longitudinal sides 26 and a pair of oppositely disposed, vertically extending, lateral sides 28. As shown, each of the longitudinal sides 26 of the pusher 12 has a plurality of grooves, a typical one being generally indicated by reference numeral 30, and alternate lands, a typical one being generally indicated by reference numeral 32. It should be understood, however, that the grooves 30 and lands 32 are not necessary for the operation of the present invention. Projections 34 depend from the pusher 12 proximate each of four lower corners thereof and are aligned with opposing recesses 36 in the base 18. Flat end leads 23 from the multilead electronic component 20 extend through the recesses 36 and are pressed downwardly by the projections 34 into the recesses 36 when the pusher 12 is forced downwardly.

The ring 14 has a vertically extending aperture, generally indicated by reference numeral 38, that receives the pusher 12. The aperture is defined by a pair of oppositely disposed, vertically extending, longitudinal sides 40 and a pair of oppositely disposed, vertically extending, lateral sides 42. Each of the longitudinal sides 40 has a plurality of grooves, a typical one being generally indicated by reference numeral 44, and alternate lands, a typical one being generally indicated by reference numeral 46. The grooves 30 and lands 32 of the pusher 12 respectively mesh with the lands 46 and grooves 44 of the ring 14, which allows the pusher 12 to be slid vertically within the aperture 38 of the ring 14. Again, it should be understood that the grooves 30 and lands 32 are not necessary for the operation of the present invention.

Figure 4A:
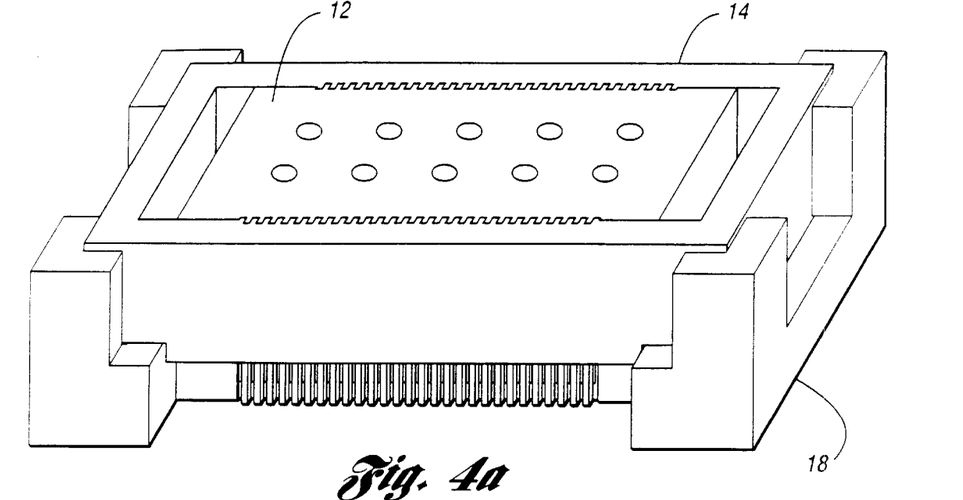
FIG. 4a is a perspective view similar to that of FIG. 2 but with all elements mutually engaged.

The base 18 has, at each of its corners, a vertical guide 56 having an L-shaped cross section. Each vertical guide 56 receives a corner of the ring 14 and guides it when it is lowered (FIG. 4a) toward the mandrel 16. The mandrel 16 formed in the base 18 has a pair of oppositely opposed, vertically extending, longitudinal sides 58, each of which has a plurality of grooves, a typical one being generally indicated by reference numeral 60, and alternate lands, a typical one being generally indicated by reference numeral 62.

Figure 2:
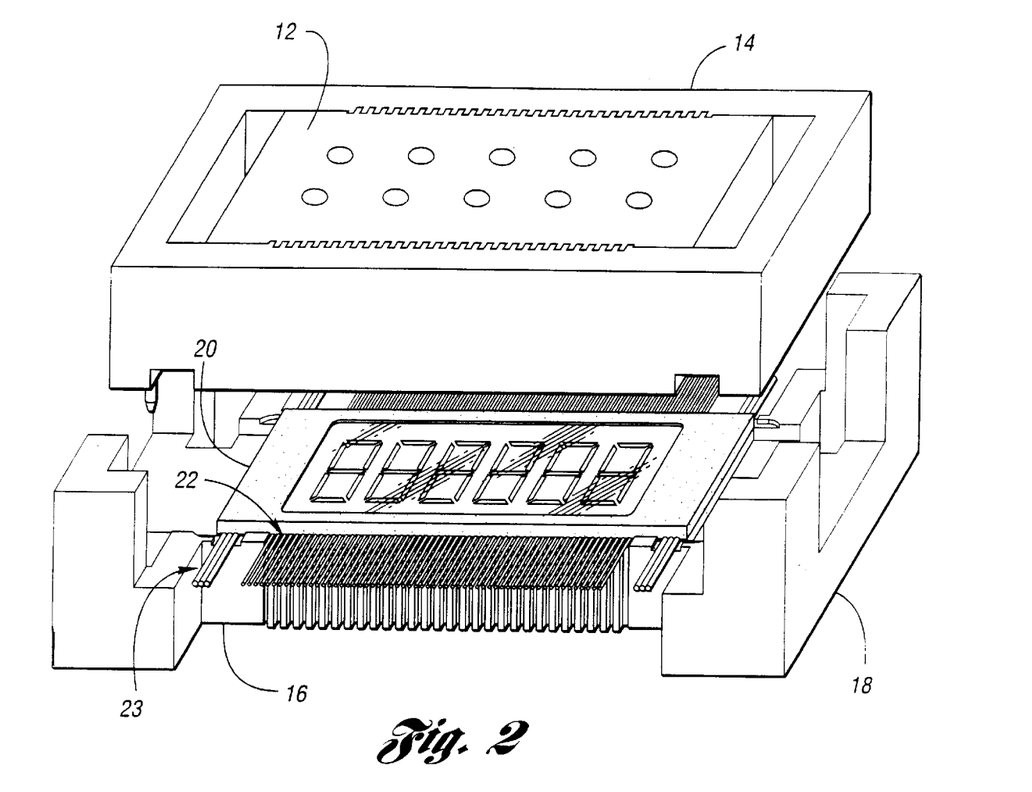
FIG. 2 is a view similar to that shown in FIG. 1 but with the pusher engaged within a vertically extending aperture in the ring and the multilead electronic component positioned atop the mandrel before the component's leads are bent.
Figure 3:
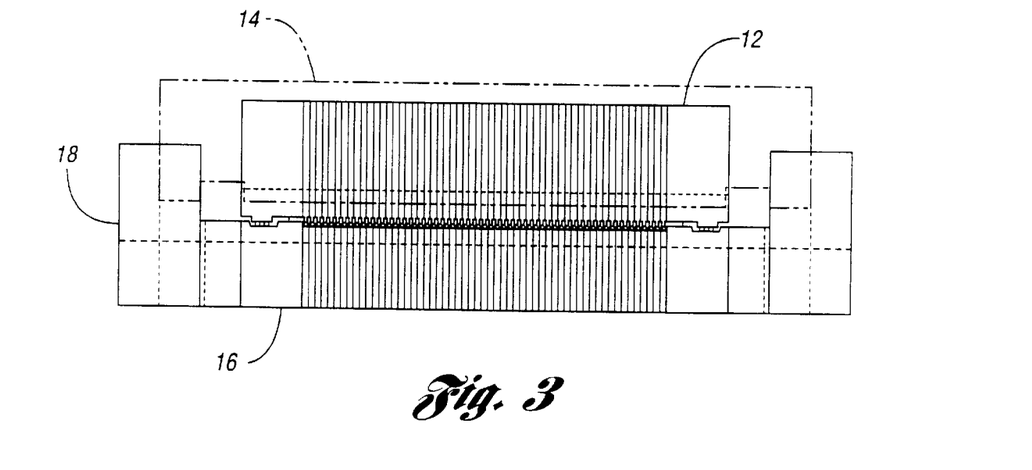
FIG. 3 is a front view of the elements shown in FIG. 2 shown partially in broken lines and shown with all elements mutually engaged.

FIG. 2 shows the pusher 12 in residence within the ring 14 and the multilead electronic component 20 positioned atop the mandrel 16. From this position, the pusher 12 and ring 14 are lowered to the position shown in FIGS. 3, 4A and 4B to clamp and bend the leads 22 respectively.

Figure 4B:
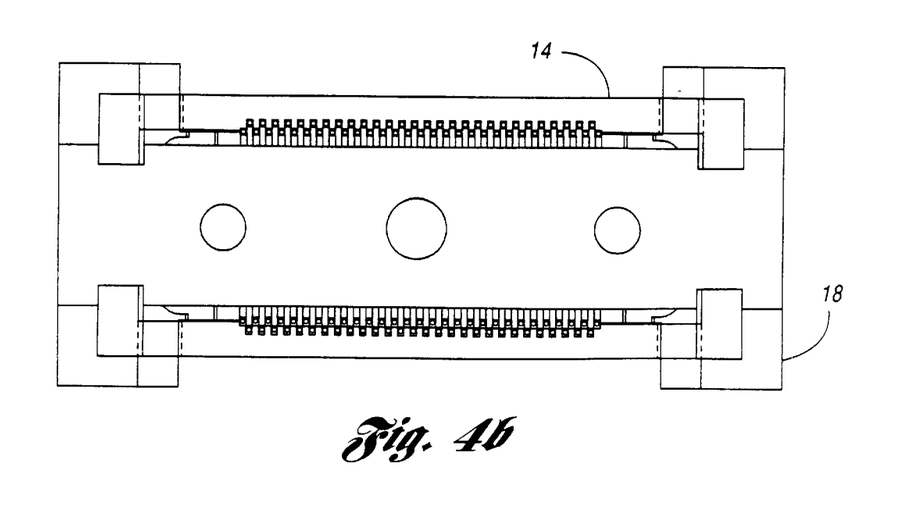

When lowered, the ring 14 closely admits the mandrel 16. The lands 62 of the mandrel 16 are aligned in apposition to but not within the grooves 44 of the ring 14, and the lands 46 of the ring 14 are aligned in apposition to but not within the grooves 60 of the mandrel 16 (FIG. 4b). A positionable double ram, generally indicated by reference numeral 66 (FIGS. 11A, 11B and 11C), or any well-known device capable of a similar function, may be used to hold, position and move the ring 14 up and down and laterally. When the ring 14 is lowered (FIG. 4a), it bends a distal portion of the leads 22 downwardly over the mandrel 16 to a vertical disposition. The upper end of each groove 60 in the mandrel 16 is radiused to provide a smooth transition of tension and compression forces near the bend in each lead 22. Each of the downwardly bent portions of the leads 22 assumes residence alternately in a groove in the ring 14 and a groove in the mandrel 16, two rows of leads 22 thereby being formed (FIG. 4*b*). It should be noted that groove bottoms may be flat or rounded and that lands may respectively be flat or rounded.

Figure 5:
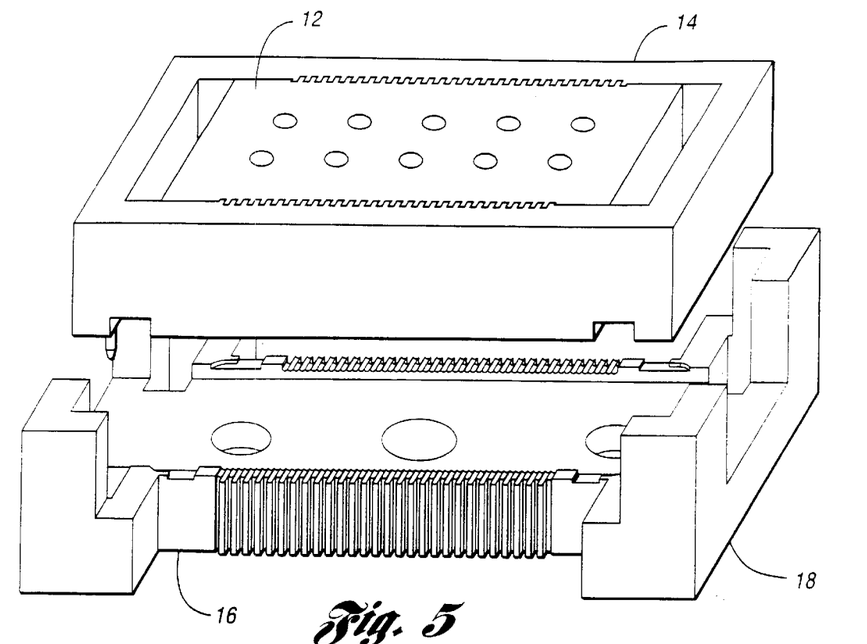
FIG. 5 is a view similar to that shown in FIG. 2, but with the multilead electronic component disposed within the ring after the component's leads have been bent downward.

FIG. 5 shows the ring 14 and the pusher 12 after they have been raised from engagement with the mandrel 16. The multilead electronic component 20 is held in residence within the ring 14 by the springback forces of the bent leads 22.

Figure 9:
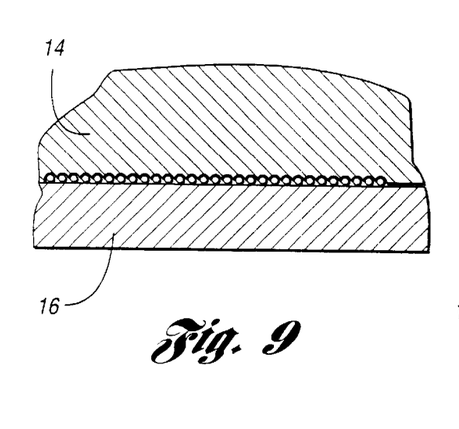
FIG. 9 is a partially broken away sectional view of a portion of the interface between the ring and the mandrel and showing a side of the vertically extending ring aperture having grooves and lands, the multilead electronic component leads being shown in the ring grooves and aligned in a single row.
Figure 10:
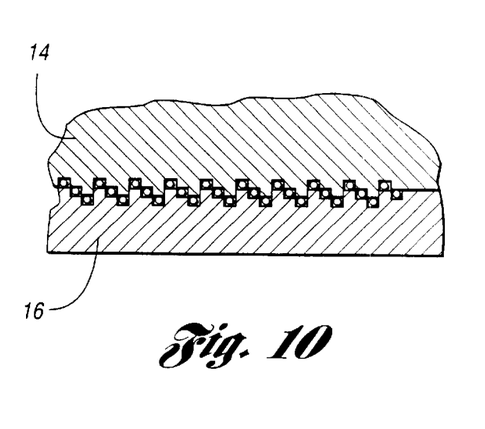
FIG. 10 is a partially broken away sectional view of a portion of the interface between the ring and the mandrel and showing a side of the vertically extending ring aperture and a side of the mandrel each have grooves and lands, the multilead electronic component leads being shown in grooves of both the ring and the mandrel and aligned in three rows.

A first alternate version of the present invention includes a mandrel that has no grooves and lands (FIG. 9). The first alternate version bends leads 22 to form only one row thereof. A second alternate version includes grooves in the ring 14 and the mandrel 16 that have a stepped configuration (FIG. 10) such that three rows of leads 22 are formed. Of course, more rows could be produced in a similar manner.

Figure 16:
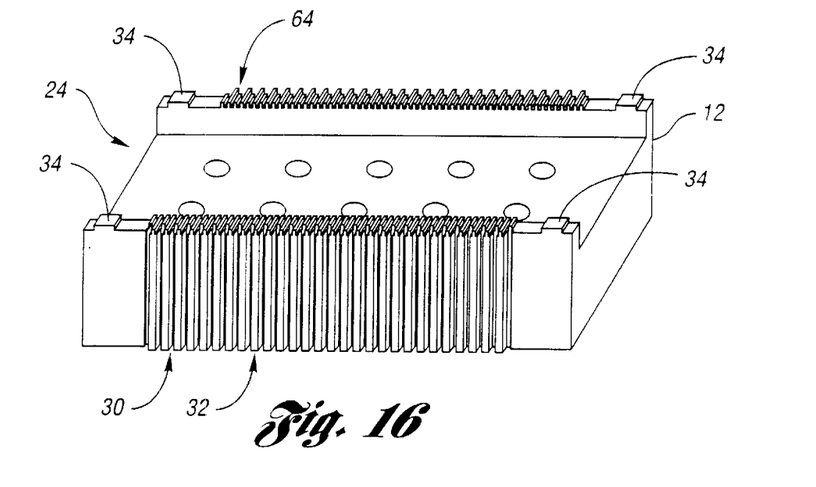
FIG. 16 is a perspective, underside view of the pusher of FIG. 1.

Depending from the pusher 12 is a projection for each lead 22, a typical one being generally indicated by reference numeral 64 (FIG. 16). These press the leads 22 against the mandrel 16 and prevent any movement of the leads 22, while they are being bent, that might crack the material of the multilead electronic component 20 through which the leads 22 pass.

Figure 6:
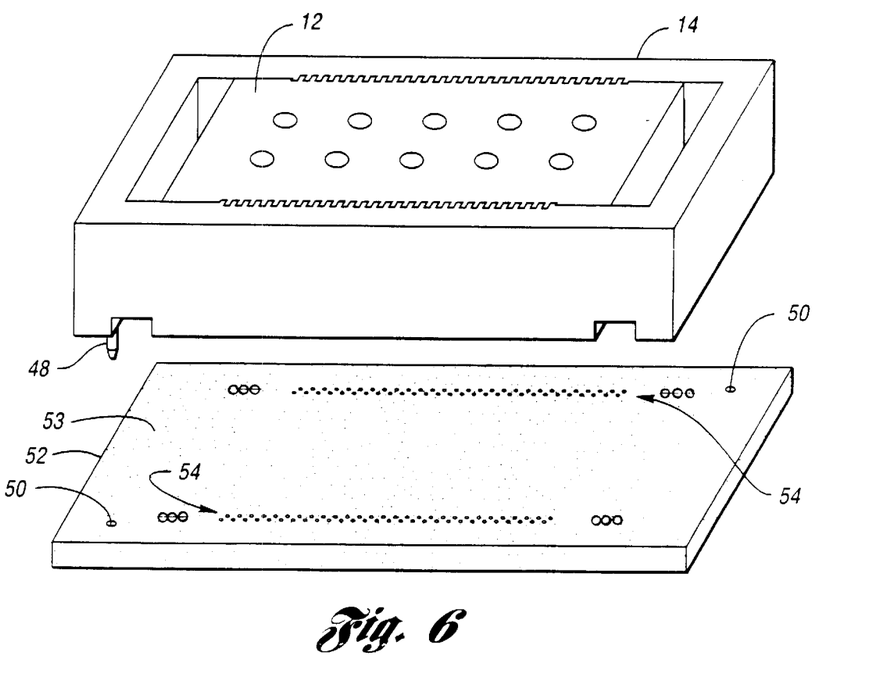
FIG. 6 is a perspective view of the ring with the pusher and the multilead electronic component engaged therein, the combination being positioned above a printed-circuit board having connection apertures through which the leads of the multilead electronic component are to be fed.

An alignment pin 48 depends from the ring 14 proximate each of two diagonally opposite lower corners thereof and is received within one of two matching apertures 50 in a printed-circuit board 52 (FIG. 6). The printed-circuit board has a surface 53 that defines a major plane thereof. The alignment pins 48 extend beyond the leads 22 to align the ring 14 and the multilead electronic component 20 with respect to the printed-circuit board 52 before the leads 22 contact the printed-circuit board 52 so that the component leads 22 are aligned with connection apertures, generally indicated by reference numeral 54 (FIG. 6) therein. It should be noted that the alignment pins 48 are not absolutely necessary but are commonly used.

Figure 7:
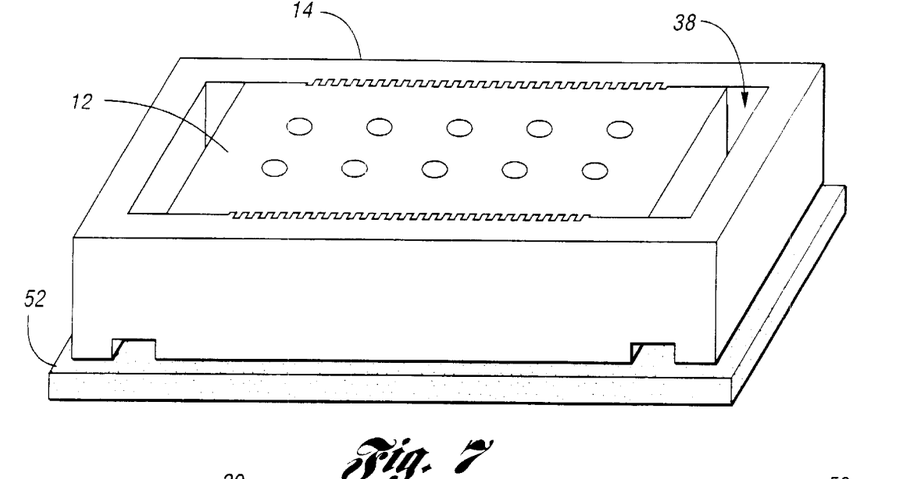
FIG. 7 is a is a view similar to that shown in FIG. 6, but with the ring disposed against the printed-circuit board.
Figure 8:
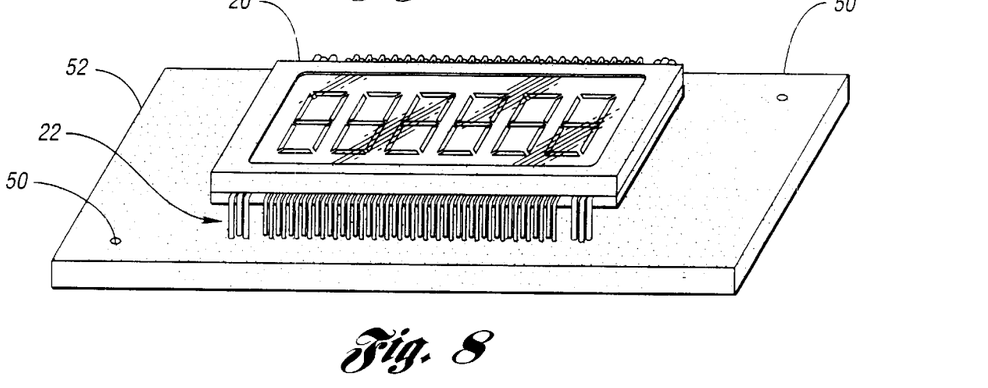
FIG. 8 is a view similar to FIG. 7, but with the ring and pusher removed to show the leads of the multilead electronic component extending through the printed-circuit board.

FIG. 7 shows the ring 14 after having been pressed against the printed-circuit board 52. FIG. 8 shows the multilead electronic component 20 in place on the printed-circuit board after the ring 14 and the pusher 12 have been removed. It should be noted that, especially when relatively thick and therefore stiff leads are involved, the ring 14 can be manually positioned over a printed-circuit board 52 and pressed against it to seat the alignment pins 48 within the alignment apertures 50. The pusher 12 can then be manually pressed to insert the leads 22 of the multilead electronic component 20 into the connection apertures 54 in the printed-circuit board 52. If, as mentioned, the leads are relatively thick, the pusher 12 need not be used. As shown by FIG. 1, leads at the ends of each row thereof have a sufficient cross-section, for example, double that of the other leads, to resist inadvertent bending.

Figure 11A:
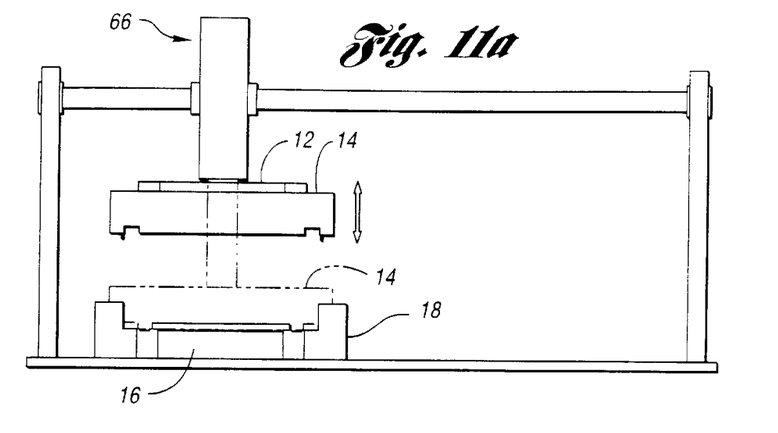
FIG. 11a is a side view of a positionable double ram shown holding the ring and pusher above the mandrel in preparation of lowering the ring and pusher to engage the mandrel and bend the leads of a multilead electronic component downwardly.
Figure 11B:
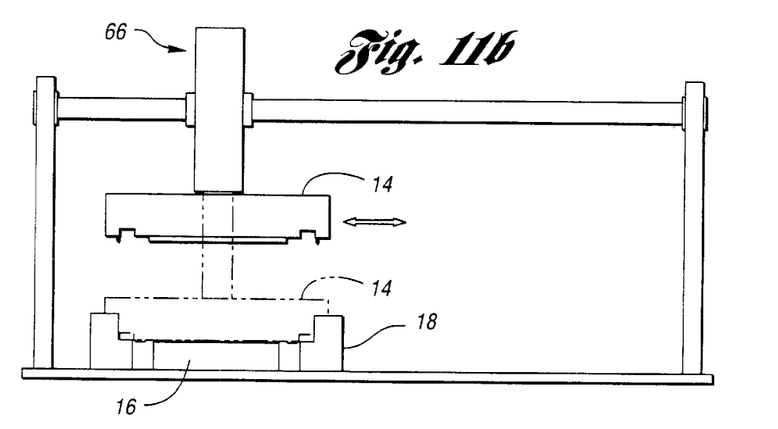
FIG. 11b is a view similar to that of FIG. 11a but showing the ring and pusher after they have been raised to disengage the mandrel following the bending of the multilead electronic component leads.
Figure 11C:
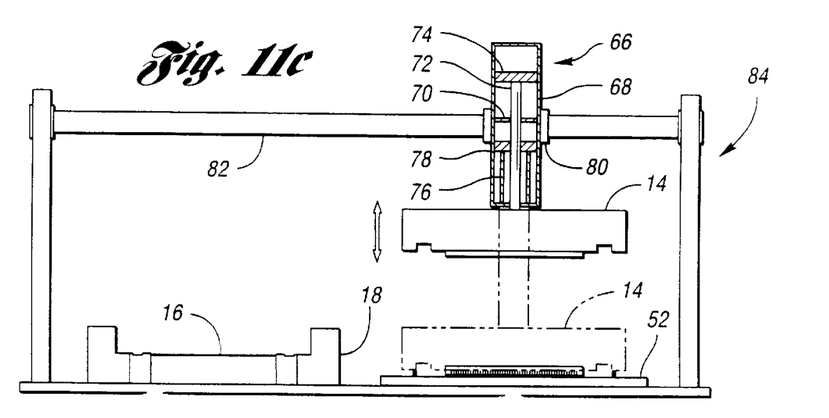
FIG. 11c is a view similar to that of FIG. 11b but showing the ring and pusher and the multilead electronic component after their having been laterally disposed to a position above a printed-circuit board in preparation of lowering the multilead electronic component to feed its leads into connection holes in the printed-circuit board.

FIG. 11*a* shows a positionable double ram, generally indicated by reference numeral 66, a typical one of a number of devices that could be used to move the ring 14 and pusher 12 downwardly to bend the electric leads 22 of the multilead electronic component 20. It should be noted that a specialized gripper or a selectively compliant articulated robot arm (SCARA), neither of which is shown, could also be used. The final downward position of the ring 14 is indicated by broken lines FIG. 11*b* is a view similar to that of FIG. 11*a* but shows the ring 14 after it has bent the leads 22 and has been raised with the multilead electronic component 20 within it, held there by the springback forces of the leads 22, which forces them against the inside of the ring 14. The previous position of the ring 14 is indicated by broken lines. FIG. 11*c* is a view similar to that of FIG. 11*b* but shows the ring 14 and the multilead electronic component 20 after they have been laterally translated to a position above a printed-circuit board 52. The next position of the ring 14 is shown in broken lines. The pusher is then pressed downwardly, lowering the position of the multilead electronic component 20 and inserting the leads 22 thereof into the connection apertures 54 (FIG. 6) in the printed-circuit board 52. The ring 14 is then raised and laterally translated to the position shown in FIG. 11*a* in anticipation of the start of another cycle.

FIG. 11*c* also provides a representative view of the basic elements inside the positionable double ram 66. The pusher 12 and the ring 14 are removably connected to the ram 66 by any well-known fasteners such as screws or the like (not shown). The ram 66 includes a cylinder 68 that is divided into two chambers by a seal 70. A central shaft 72 is connected to an upper piston 74 and extends downwardly through the seal 70 to force the pusher 12 downwardly when the upper piston 74 is forced in that direction by fluid pressure supplied by any well-known means (not shown). A hollow shaft 76 is connected to a lower piston 78 and extends downwardly to force the ring 14 downwardly when the lower piston 78 is forced in that direction by fluid pressure. The cylinder 68 is attached to an internally threaded bushing 80, through which a screw 82 is threaded. The screw 82 is rotatably supported on a frame, generally indicated by reference numeral 84. When the screw 82 is rotated by any well-known means (not shown), the cylinder 68 is laterally translated in a direction dictated by the direction of rotation of the screw 82.

Figure 12:
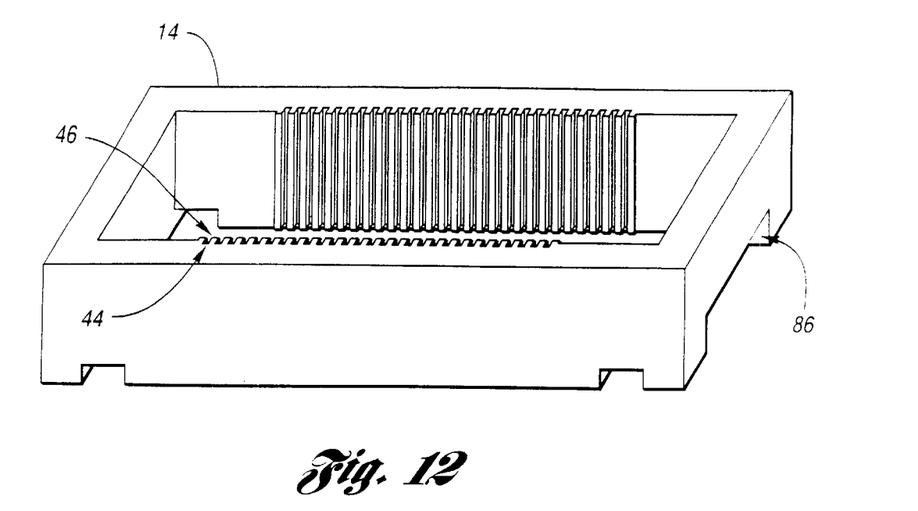
FIG. 12 is a perspective view of a ring similar to that of FIG. 1 but having a longitudinal lower channel to admit ends of the multilead electronic component.
Figure 13:
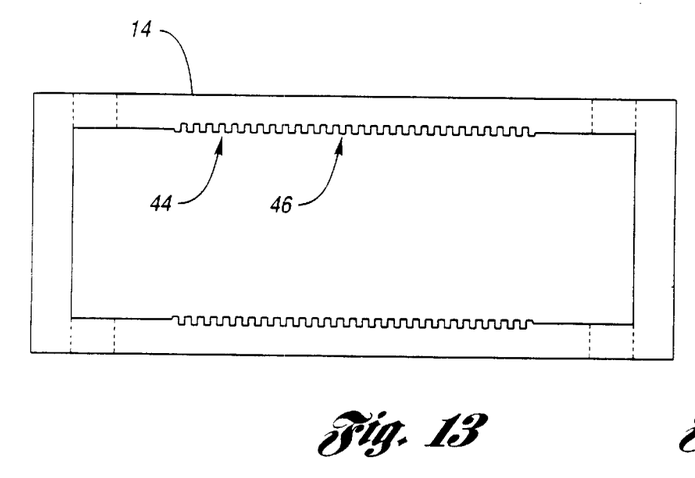
FIG. 13 is a plan view, having broken lines representing internal structures, of the ring of FIG. 12.
Figure 14:
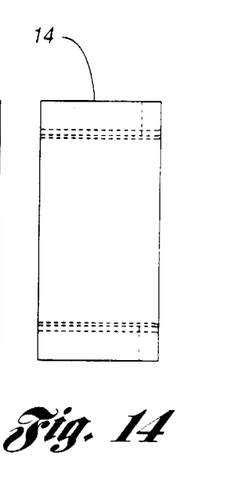
FIG. 14 is an end view, having broken lines representing internal structures, of the ring of FIG. 13.
Figure 15:
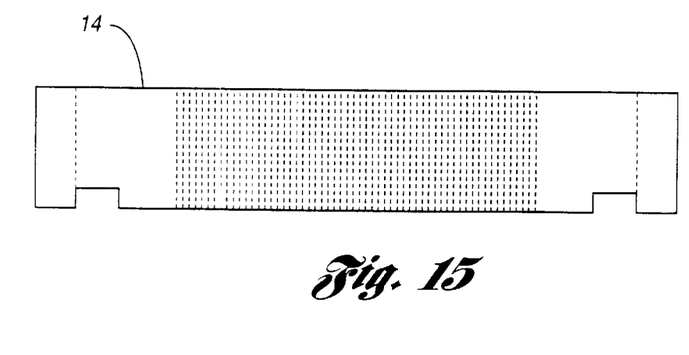
FIG. 15 is a side view, having broken lines representing internal structures, of the ring of FIG. 15.
Figures 17, 18:
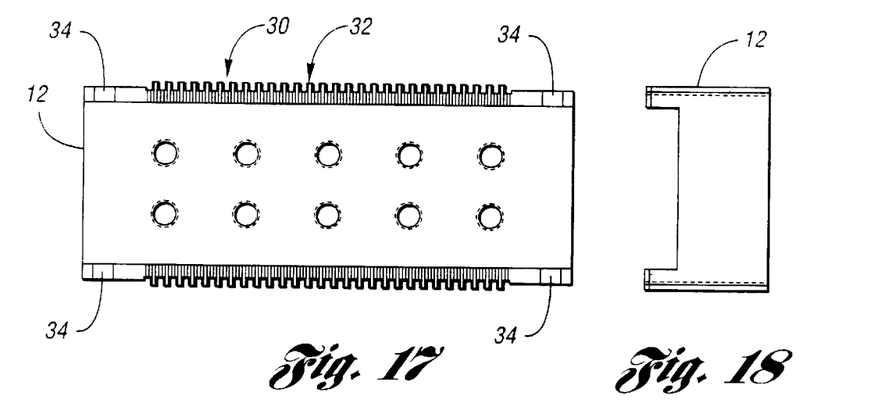
FIG. 17 is a view of the underside of the pusher of FIG. 1.
FIG. 18 is an end view, having broken lines representing internal structures, of the pusher of FIG. 17.
Figure 19:
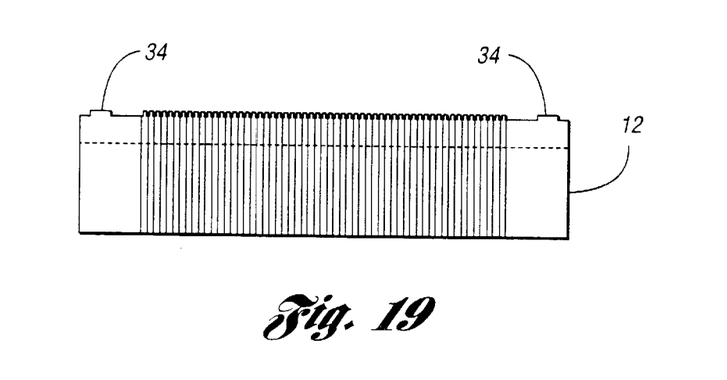
FIG. 19 is an upside-down side view, having broken lines representing internal structures, of the pusher of FIG. 17.
Figure 20:
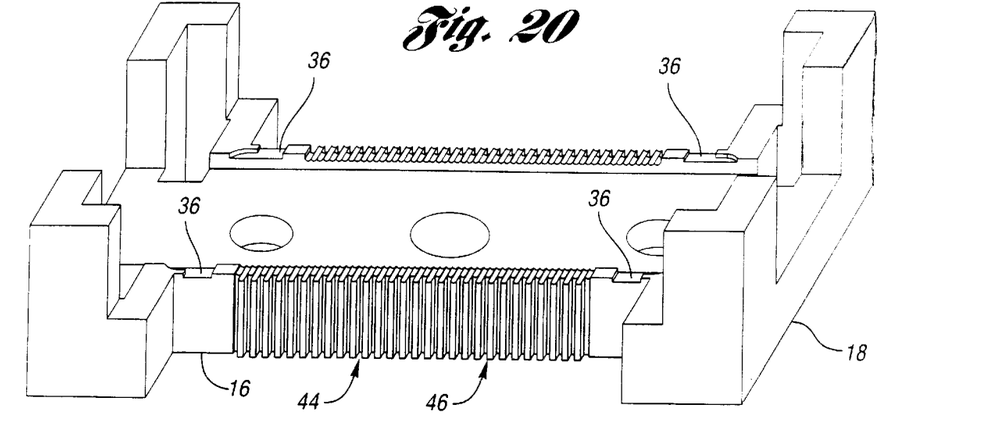
FIG. 20 is a perspective view of the base and mandrel of FIG. 1
Figure 21:
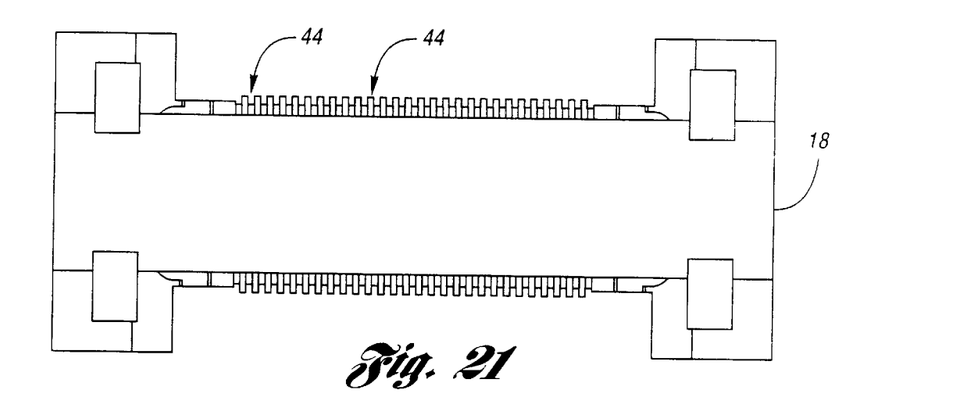
FIG. 21 is a bottom view of the base and mandrel of FIG. 20.
Figure 22:
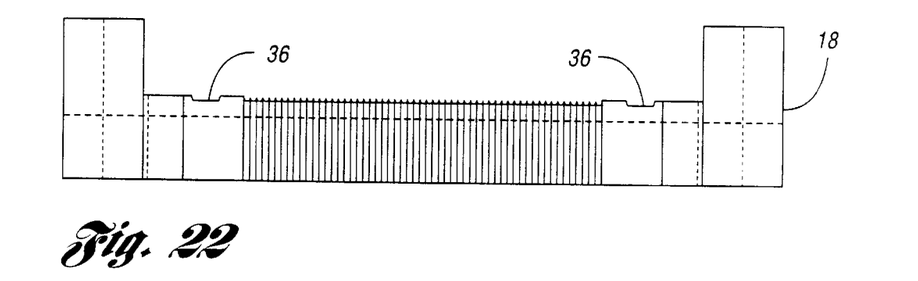
FIG. 22 is a side view, having broken lines representing internal structures, of the base and mandrel of FIG. 21.
Figure 23:
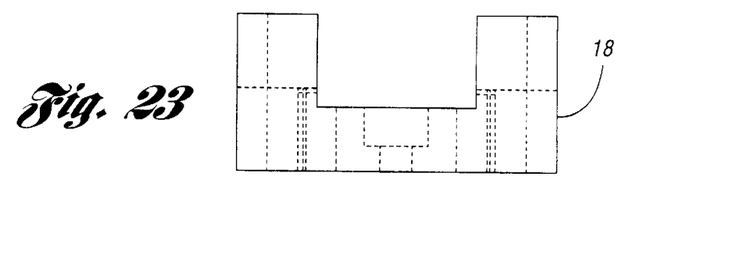
FIG. 23 is an end view, having broken lines representing internal structures, of the base and mandrel of FIG. 22.

FIGS. 12 through 15 are respective perspective, plan, end and side views of the ring 14. FIGS. 12 and 13 show in detail the grooves 44 and lands 46 of the ring 14, and a longitudinal lower channel, generally indicated by the reference numeral 86, to admit ends of the multilead electronic component 20. FIGS. 14 and 15 include broken lines to indicate internal structural details. FIGS. 16 through 19 are respective perspective, bottom, end and side views of the pusher 12. FIG. 16 shows in detail projections 64, that clamp leads 22, against the mandrel 16 on the underside of the pusher 12. FIGS. 16 and 17 show in detail the grooves 30 and lands 32 of the pusher 12, and FIGS. 18 and 19 include broken lines to indicate internal structural details. FIGS. 20 through 23 are respective perspective, bottom, side and end views of the base 18. FIGS. 20 and 21 show in detail the grooves 44 and lands 46 of the ring 14, and FIGS. 22 and 23 include broken lines to indicate internal structural details.

Figure 24:
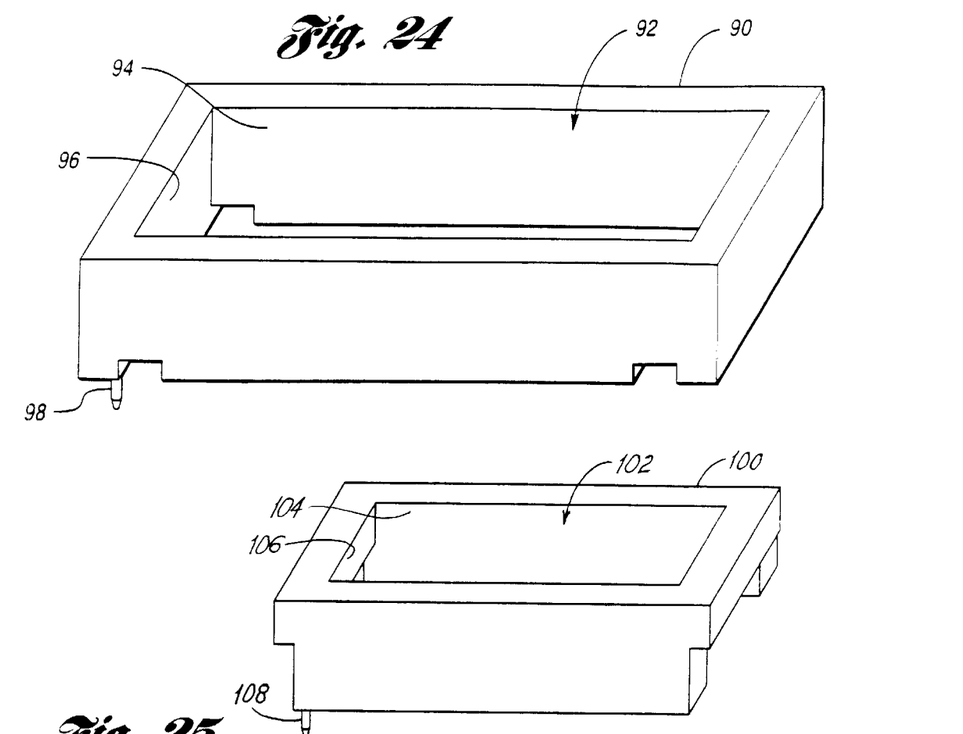
FIG. 24 is a perspective view of an alternative ring having no internal lands and grooves.

FIG. 24 shows a ring 90 that has opposing longitudinal sides 94 and lateral sides 96, the sides defining therebetween an aperture, generally indicated by the reference numeral 92. The ring 90 is similar to the ring 14 (FIG. 1) except that the longitudinal sides 94 have no grooves therein. An alignment pin 98 extends from the ring 90 proximate each of two diagonally opposite corners thereof and is received within one of two matching apertures 50 in the printed-circuit board 52 (FIG. 6). As with the alignment pins 48 of ring 14, the alignment pins 98 of ring 90 extend beyond the electric leads 22 to align the ring 90 and the multilead electronic component 20 therewithin with respect to the printed-circuit board 52 (FIG. 6) before the leads 22 are fed through the connection apertures 50 in the printed-circuit board 52.

Figure 25:
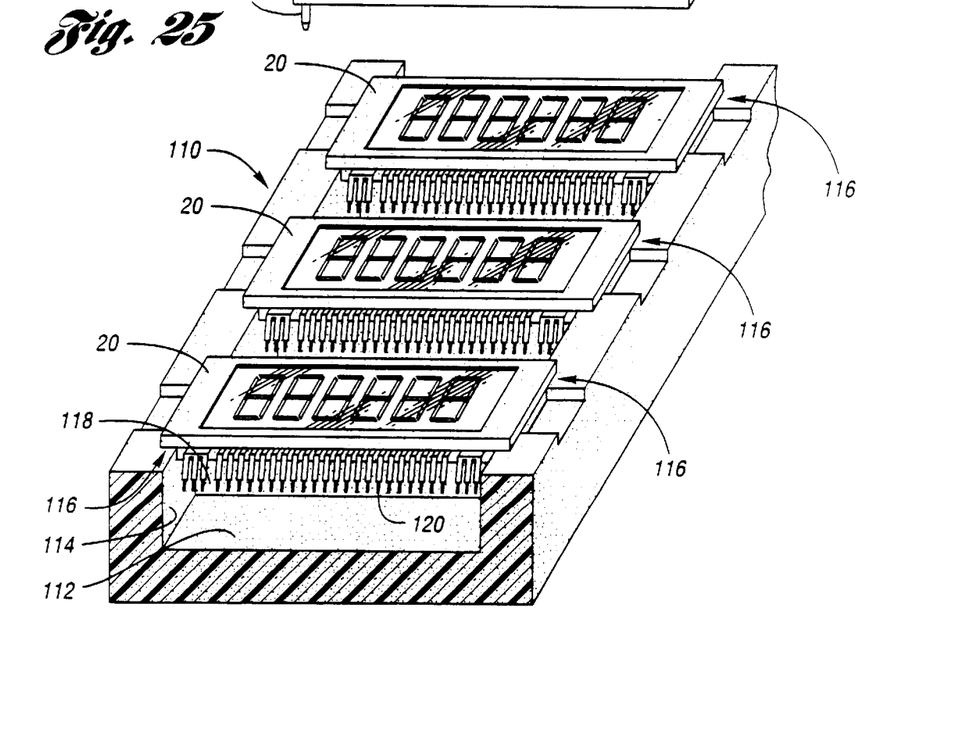
FIG. 25 is a perspective view of a portion of a typical shipping container supporting therein several multilead electronic components and also of a second embodiment including a ring modified to be used for manually extracting the components.

FIG. 25 is a perspective view of a manual ring 100 and of a representative shipping container, generally indicated by the reference numeral 110. The manual ring 100 has been designed for use in manually picking up and manipulating a multilead electronic component 20. The manual ring 100 has opposing longitudinal sides 104 and lateral sides 106, the sides defining therebetween an aperture, generally indicated by the reference numeral 102. The manual ring 100 is similar to the ring 90 (FIG. 24) except that its vertical dimension, as illustrated, is greater to facilitate manual handling thereof.

An alignment pin 108 extends from the manual ring 100 proximate each of two diagonally opposite corners thereof and is received within one of two matching apertures 50 in the printed-circuit board 52 (FIG. 6). As with the alignment pins 98 of ring 90, the alignment pins 108 of manual ring 100 extend beyond the electric leads 22 to align the manual ring 100 and the multilead electronic component 20 therewithin with respect to the printed-circuit board 52 before the leads 22 are fed through the connection apertures 50 in the printed-circuit board 52.

The shipping container 110 is made, for example, from any of a number of common, light but sturdy, molded material. It includes a base 112 and a pair of opposing walls 114 extending at right angles therefrom to form a squared U-shaped structure. The upper portions of the walls 114 have notches, generally indicated by the reference numerals 116, that provide residences for supporting comers of the multilead electronic components 20. Supports 118 extend between the walls 114 and provide structural support for the shipping container. The longitudinal dimension of a lower portion of the manual ring 100 is reduced to fit between the walls 114 of the shipping container 110 to facilitate pressing the manual ring 100 over the multilead electronic components 20.

Although the manual ring 100 could be positioned by a robot such as the positionable double ram 66 (FIG. 11c), it has been designed for efficient use in manually removing multilead electronic components 20 from the shipping container 110, in forming electric leads 120 (FIG. 25) to align them for insertion in the connection apertures in the printed-circuit board 52, and in feeding electric leads through the connection apertures 54.

While embodiments and alternate versions of the invention have been illustrated and described, it is not intended that these embodiments illustrate and describe all possible forms of the invention. Rather, the words used in the specification are words of description rather than limitation, and it is to be noted that various changes may be made without departing from the spirit and scope of the invention.

What is claimed is:

1. An apparatus to facilitate feeding, through connection apertures in a printed-circuit board having a major plane, a plurality of electric leads having proximate portions extending in at least two generally opposite directions from a multilead electronic component, remaining portions of the electric leads being prebent in the direction of feeding to form an angle greater than 90 degrees with respect to the proximate portions, the apparatus comprising:

a ring having an aperture extending therethrough and having dimensions that allow the ring to be pressed over the multilead electronic component, the ring aperture being defined by at least two opposing sides that contact and further bend the electric leads while maintaining a desired electric lead centerline separation, the multilead electronic component thereafter being temporarily retained within the ring aperture by virtue of springback forces within the bent electric leads acting against the at least two opposing sides to position the electric leads of the multilead electronic component relative to the connection apertures in the printed-circuit board, the ring further having therein a channel extending at right angles to the ring aperture and traversing a side of the ring facing in the direction of feeding to receive therein a portion of the multilead electronic component so that, when the ring is pressed against the printed-circuit board, the multilead electronic component is positioned at a specified distance from the printed-circuit board.

2. The apparatus as defined by claim 1, wherein the at least two opposing sides of the ring aperture have alternate grooves and lands that extend parallel to the direction of the ring aperture to maintain the orientation of electric leads that are not sufficiently strong to be self-supporting.

3. The apparatus as defined by claim 2, further including:

a pusher having at least two opposing sides that are closely admitted within the ring aperture, the pusher being slidable within the ring aperture to press the multilead electronic component toward the printed-circuit board, feed the electric leads through the connection apertures, and secure the multilead electronic component in place while the ring is being withdrawn.

4. The apparatus as defined by claim 2, further including:

at least a pair of spaced apart alignment pins extending from the ring, the alignment pins being received by cooperating alignment apertures defined in the printed-circuit board when the ring retaining the multilead electronic component is pressed theretoward.

5. An apparatus for configuring and feeding electric leads of a multilead electronic component through connection apertures in a printed-circuit board having a major plane, the electric leads extending from the multilead electronic component in at least two generally opposite directions, the apparatus comprising:

a mandrel having a plurality of peripheral sides, at least two of which are opposing sides, and a surface for supporting the multilead electronic component; and a ring having an aperture extending therethrough that closely admits the mandrel, the ring having dimensions that allow it to be pressed over the multilead electronic component, the ring aperture being defined by at least two opposing sides that cooperate with the at least two opposing sides of the mandrel to bend the electric leads about the mandrel to align them for insertion in the apertures in the printed-circuit board while maintaining a desired electric lead centerline separation, the multilead electronic component thereafter being, by virtue of springback forces within the bent electric leads acting against the at least two opposing sides of the ring, retained within the ring aperture when the ring is subsequently retracted from the mandrel and positioned relative to the printed-circuit board, the ring aligning the electric leads of the multilead electronic component with the connection apertures in the printed-circuit board.

6. The apparatus as defined by claim 5, wherein the ring has defined therein a channel extending at right angles to the ring aperture and traversing a side of the ring facing the printed-circuit board to receive therein a portion of the multilead electronic component so that, when the ring is pressed against the printed-circuit board, the multilead electronic component is positioned at a specified distance from the printed-circuit board.

7. The apparatus as defined by claim 6, wherein the at least two opposing sides of the ring aperture have alternate grooves and lands that extend parallel to the direction of the ring aperture to maintain the orientation of electric leads that are not sufficiently strong to be self-supporting.

8. The apparatus as defined by claim 7, wherein the at least two opposing sides of the mandrel have alternate grooves and lands that extend parallel to the direction of and cooperate with the grooves and lands of the ring.

9. The apparatus as defined by claim 8, further including:
   a pusher having at least two opposing sides that are closely admitted within the ring aperture, the pusher being slidable within the ring aperture to press the multilead electronic component toward the printed-circuit board, feed the electric leads through the connection apertures, and secure the multilead electronic component in place while the ring is being withdrawn.

10. The apparatus defined by claim 9, wherein the pusher has depending therefrom projections that press the electric leads against the mandrel and prevent cracking the material of the multilead electronic component by any movement of portions of the electric leads disposed between the point at which each electric lead is pressed by the pusher against the mandrel and the multilead electronic component while the electric leads are being bent as the ring is pressed over the multilead electronic component.

11. The apparatus as defined by claim 9, further including:
   at least a pair of spaced apart alignment pins extending from the ring, the alignment pins being received by cooperating alignment apertures defined in the printed-circuit board when the ring retaining the multilead electronic component is pressed theretoward.

* * * * *